United States Patent
Wang et al.

(10) Patent No.: US 11,626,297 B2
(45) Date of Patent: Apr. 11, 2023

(54) APPARATUS AND METHOD FOR WET PROCESS ON SEMICONDUCTOR SUBSTRATE

(71) Applicant: ACM Research (Shanghai) Inc., Shanghai (CN)

(72) Inventors: Hui Wang, Shanghai (CN); Xi Wang, Shanghai (CN); Cheng Cheng, Shanghai (CN); Jun Wu, Shanghai (CN)

(73) Assignee: ACM RESEARCH (SHANGHAI), INC., Shanghai (CN)

( * ) Notice: Subject to any disclaimer, the term of this patent is extended or adjusted under 35 U.S.C. 154(b) by 890 days.

(21) Appl. No.: 16/344,517

(22) PCT Filed: Oct. 25, 2016

(86) PCT No.: PCT/CN2016/103150
§ 371 (c)(1),
(2) Date: Apr. 24, 2019

(87) PCT Pub. No.: WO2018/076151
PCT Pub. Date: May 3, 2018

(65) Prior Publication Data
US 2019/0244836 A1   Aug. 8, 2019

(51) Int. Cl.
H01L 21/67 (2006.01)
B08B 3/04 (2006.01)
H01L 21/02 (2006.01)

(52) U.S. Cl.
CPC .......... *H01L 21/67051* (2013.01); *B08B 3/04* (2013.01); *H01L 21/02057* (2013.01)

(58) Field of Classification Search
None
See application file for complete search history.

(56) References Cited

U.S. PATENT DOCUMENTS 5,254,205 A * 10/1993 Tsutsumi .............. B24B 37/345
156/154
2003/0192570 A1   10/2003 Thakur et al.
(Continued)

FOREIGN PATENT DOCUMENTS

CN         204216011 U    3/2015
CN         105289923 A    2/2016
(Continued)

OTHER PUBLICATIONS

Office Action issued in corresponding JP Application No. 2019-522438 dated Sep. 29, 2020 (6 pages).
(Continued)

*Primary Examiner* — Natasha N Campbell
*Assistant Examiner* — Ryan L Coleman
(74) *Attorney, Agent, or Firm* — Osha Bergman Watanabe & Burton LLP

(57) ABSTRACT

An apparatus and a method for wet process on a semiconductor substrate are provided. The apparatus includes a process chamber (1005), a chuck (1002) for holding and positioning a semiconductor substrate (1001) disposed in the process chamber, a rotating driving mechanism (1004) driving the chuck to rotate, a chamber shroud (1006) disposed surrounding the process chamber, at least one vertical driving mechanism driving the chamber shroud to move up or down, a shielding cover (1007), at least one driving device (1008) driving the shielding cover to cover down or lift up, at least one dispenser module (1014) having a dispenser (1030) for spraying liquid to the surface of the semiconductor substrate. When the shielding cover covers above the process chamber, the chamber shroud is moved up to couple with the shielding cover, so as to seal the process chamber for preventing the liquid from splashing out of the process chamber.

23 Claims, 14 Drawing Sheets

(56) References Cited

U.S. PATENT DOCUMENTS

| | | | | |
|---|---|---|---|---|
| 2006/0042664 A1* | 3/2006 | Hardikar | ........... | H01L 21/67051 |
| | | | | 134/32 |
| 2007/0134601 A1* | 6/2007 | Naitou | .............. | H01L 21/67051 |
| | | | | 430/331 |
| 2008/0014358 A1* | 1/2008 | Koo | ................... | H01L 21/67028 |
| | | | | 427/372.2 |
| 2012/0186744 A1* | 7/2012 | Higashijima | ..... | H01L 21/68792 |
| | | | | 156/345.21 |
| 2012/0266925 A1* | 10/2012 | Nakashima | ......... | H01L 21/6719 |
| | | | | 134/200 |
| 2017/0117135 A1* | 4/2017 | Yoshida | ............ | H01L 21/68742 |

FOREIGN PATENT DOCUMENTS

| | | |
|---|---|---|
| JP | H10172945 A | 6/1998 |
| JP | H10242115 A | 9/1998 |
| JP | 2003266028 A | 9/2003 |
| JP | 200612881 A | 1/2006 |
| JP | 200822010 A | 1/2008 |
| JP | 201050226 A | 3/2010 |
| JP | 201672343 A | 5/2016 |

OTHER PUBLICATIONS

International Search Report issued in corresponding International Application No. PCT/CN2016/103150 dated Aug. 2, 2017 (4 pages).
Written Opinion issued in corresponding International Application No. PCT/CN2016/103150 dated Aug. 2, 2017 (3 pages).

* cited by examiner

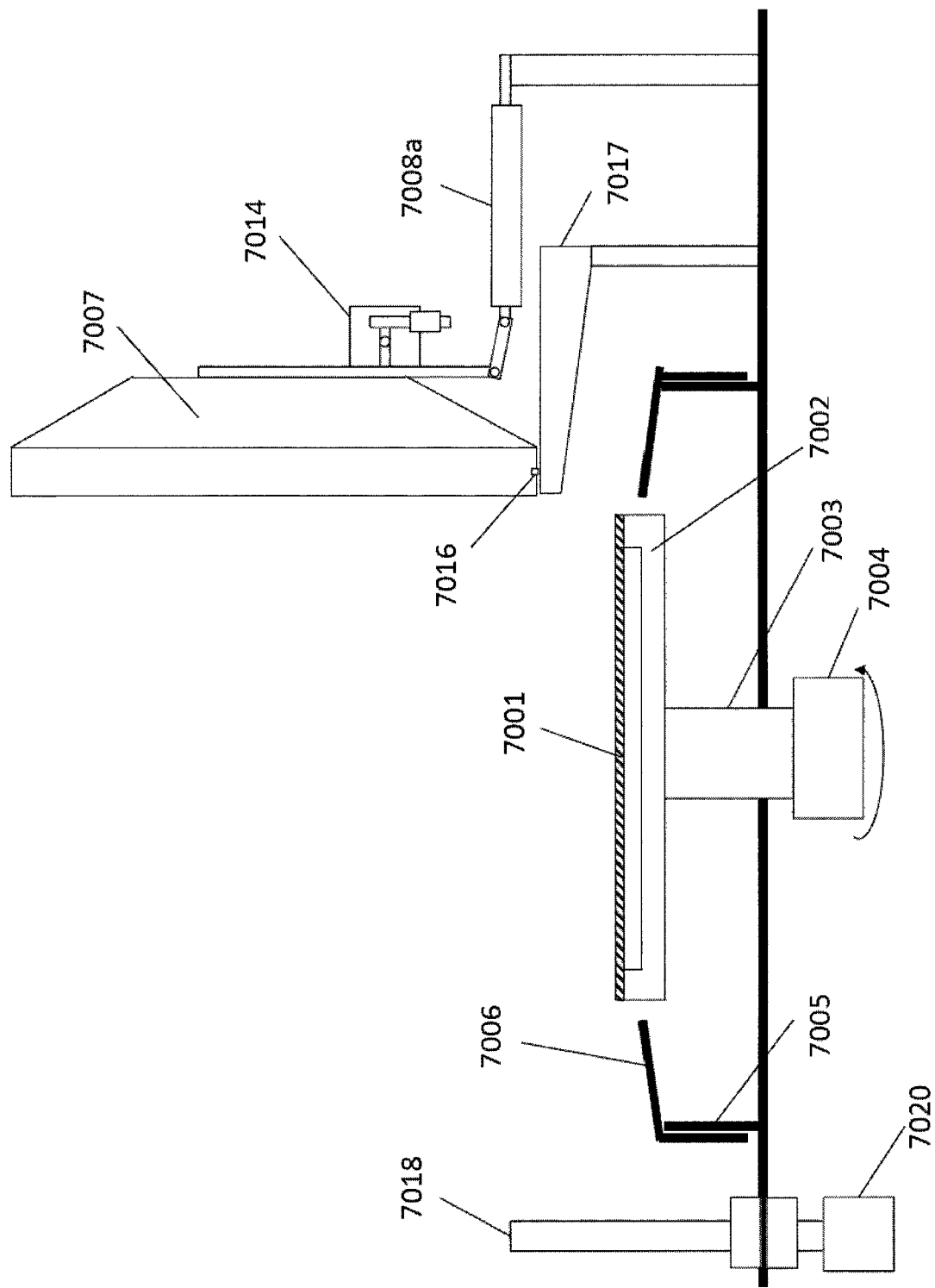

APPARATUS AND METHOD FOR WET PROCESS ON SEMICONDUCTOR SUBSTRATE

FIELD OF THE INVENTION

The present invention relates to an apparatus and method for wet process on a semiconductor substrate, which utilizes a high pressure dispenser module to spray high pressure liquid on the semiconductor substrate.

BACKGROUND

During a semiconductor device fabrication process, high pressure liquid, such as chemicals or de-ionized water, is delivered on a semiconductor substrate for a wet process such as cleaning, etching, photo-resist stripping, metal lift-off, etc. The high pressure liquid often generates serious splash and mist when it is jetted on the semiconductor substrate with pressure up to 80-3000 psi. The splashed chemical or de-ionized water will bring issues of corrosion, contamination, damage the function of parts nearby a chamber where the semiconductor substrate is processed. The splashed chemical or de-ionized water will also affect the following wet steps and drying steps which are used for processing the semiconductor substrate.

SUMMARY

Accordingly, an object of the present invention is to provide an apparatus and a method for preventing high pressure liquid from splashing out of a process chamber when the high pressure liquid is uniformly sprayed on a semiconductor substrate.

In one embodiment of the present invention, an apparatus for wet process on a semiconductor substrate includes a process chamber, a chuck for holding and positioning the semiconductor substrate disposed in the process chamber, a rotating driving mechanism driving the chuck to rotate, a chamber shroud disposed surrounding the process chamber, at least one vertical driving mechanism driving the chamber shroud to move up or move down, a shielding cover, at least one driving device driving the shielding cover to cover down or lift up, at least one high pressure dispenser module mounted on the shielding cover and having a high pressure dispenser for spraying high pressure liquid to the surface of the semiconductor substrate. When the shielding cover covers the process chamber, the chamber shroud is moved up to couple with the shielding cover, so as to seal the process chamber for preventing the high pressure liquid from splashing out of the process chamber.

In one embodiment of the present invention, a method for wet process on a semiconductor substrate includes:

moving down a chamber shroud, loading a semiconductor substrate on a chuck, moving up the chamber shroud, and rotating the semiconductor substrate;

rotating a swing nozzle into a process chamber to deliver cleaning chemical or de-ionized water to the surface of the semiconductor substrate;

stopping delivering the cleaning chemical or de-ionized water to the surface of the semiconductor substrate, rotating the swing nozzle out of the process chamber, and then moving down the chamber shroud;

driving a shielding cover to cover the process chamber;

moving up the chamber shroud to couple with the shielding cover for sealing the process chamber, and then delivering high pressure chemical or de-ionized water to the surface of the semiconductor substrate;

stopping delivering the high pressure chemical or de-ionized water to the surface of the semiconductor substrate, and then moving down the chamber shroud;

driving the shielding cover to lift up;

moving up the chamber shroud, and then rotating the swing nozzle into the process chamber to deliver cleaning chemical or de-ionized water to the surface of the semiconductor substrate;

drying the semiconductor substrate;

rotating the swing nozzle out of the process chamber, stopping rotating the semiconductor substrate, moving down the chamber shroud, and then unloading the semiconductor substrate from the chuck.

BRIEF DESCRIPTION OF THE DRAWINGS

FIG. 7A to FIG. 7H are side views illustrating a process sequence by using the exemplary apparatus to wet treat a semiconductor substrate.

DETAILED DESCRIPTION

Figure 1:
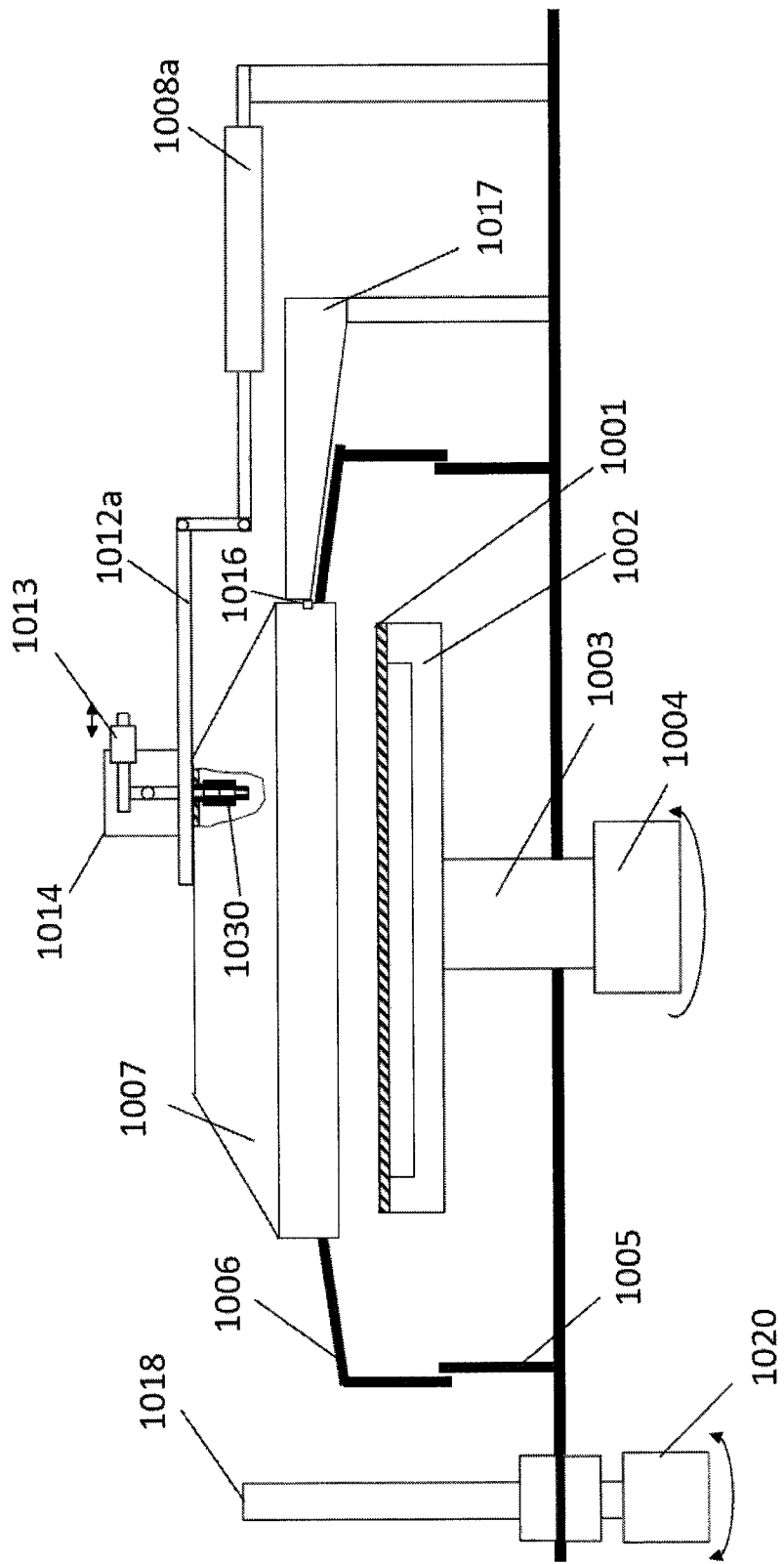
FIG. 1 is a side view illustrating an exemplary apparatus for wet process on a semiconductor substrate according to the present invention, wherein a shielding cover of the apparatus covers down to seal a process chamber of the apparatus.

The present invention provides an exemplary apparatus for wet process on a semiconductor substrate, which utilizes a shielding cover coupled with a chamber shroud to seal a process chamber, preventing high pressure liquid from splashing out of the process chamber when the high pressure liquid is uniformly sprayed on the semiconductor substrate through a high pressure dispenser module.

Referring to FIG. 1 to FIG. 4, the exemplary apparatus for wet process on a semiconductor substrate of the present invention includes a process chamber 1005 and a chamber shroud 1006 disposed surrounding the process chamber 1005. The chamber shroud 1006 connects to at least one vertical driving mechanism which drives the chamber shroud 1006 to move up or move down. A chuck 1002 for holding and positioning a semiconductor substrate 1001 is disposed in the process chamber 1005. The chuck 1002 connects to a rotating driving mechanism 1004 through a rotating spindle 1003. The rotating driving mechanism 1004 drives the chuck 1002 to rotate. The apparatus further includes a shielding cover 1007. At least one high pressure dispenser module 1014 is mounted on the shielding cover 1007. Every high pressure dispenser module 1014 has a high pressure dispenser 1030 for spraying one type of high pressure liquid, chemical or de-ionized water at pressure of 10-5000 psi to the surface of the semiconductor substrate 1001. The high pressure dispenser module 1014 has a linear actuator 1013 for controlling the scanning motion of the high pressure dispenser 1030, so that the high pressure liquid, chemical or de-ionized water can be sprayed on the surface of the semiconductor substrate 1001 uniformly from center to edge of the semiconductor substrate 1001 while the chuck 1002 is driven to rotate at speed of 20-3000 rpm.

The shielding cover 1007 is driven to cover down or lift up by at least one driving device. In one embodiment, the shielding cover 1007 is fixed on a beam 1024. Two ends of the beam 1024 connect with two arms 1012*a*, 1012*b*. The two arms 1012*a*, 1012*b* are actuated by a pair of driving devices 1008*a*, 1008*b* for driving the shielding cover 1007 to cover down or lift up. At least one drain hole 1016 is disposed on the shielding cover 1007 for liquid drain out once the shielding cover 1007 is lifted up. The drain hole 1016 is at the bottom of the shielding cover 1007 when the shielding cover 1007 is lifted up. In this way, the liquid that splashed on the top of the shielding cover 1007 will drift down to the drain hole 1016 by gravity. A drain tray 1017 is used to guide the liquid from the drain hole 1016 drift down the stream, the liquid draining out of the shielding cover 1007. At least one cleaning nozzle 1036 is disposed on the shielding cover 1007, facing the drain hole 1016 for cleaning the shielding cover 1007. In one embodiment, there are three cleaning nozzles 1036*a*, 1036*b*, 1036*c* disposed on the shielding cover 1007 for cleaning the shielding cover 1007. When the shielding cover 1007 is lifted up, at least one cleaning nozzle 1036*a*, 1036*b*, 1036*c* is at the top of the shielding cover 1007, delivering cleaning chemical or de-ionized water to the inner surface of the shielding cover 1007, so as to clean the shielding cover 1007. The cleaning chemical or de-ionized water drifts down along the inner surface of the shielding cover 1007 and drains out through the drain hole 1016 by gravity. The cleaning nozzles 1036*a*, 1036*b*, 1036*c* are mounted at an angle to prevent the cleaning chemical or de-ionized water from spraying to the inside of the chamber shroud 1006. The top section of the shielding cover 1007 is shaped in a slope or an arc for guiding the liquid down to the process chamber 1005. The delivery duration of the cleaning nozzles 1036*a*, 1036*b*, 1036*c* is programmable. The shielding cover 1007 cleaning triggering condition is programmable based on processing the number of the semiconductor substrate 1001 or time accumulation.

At least one swing nozzle 1018 is disposed beside the process chamber 1005 for delivering liquid of chemicals or de-ionized water, or drying gas on the surface of the semiconductor substrate 1001. A rotating actuator 1020 drives the swing nozzle 1018 to swing, so that the swing nozzle 1018 can swing in the process chamber 1005 and scan across the whole surface of the semiconductor substrate 1001.

Figure 2:
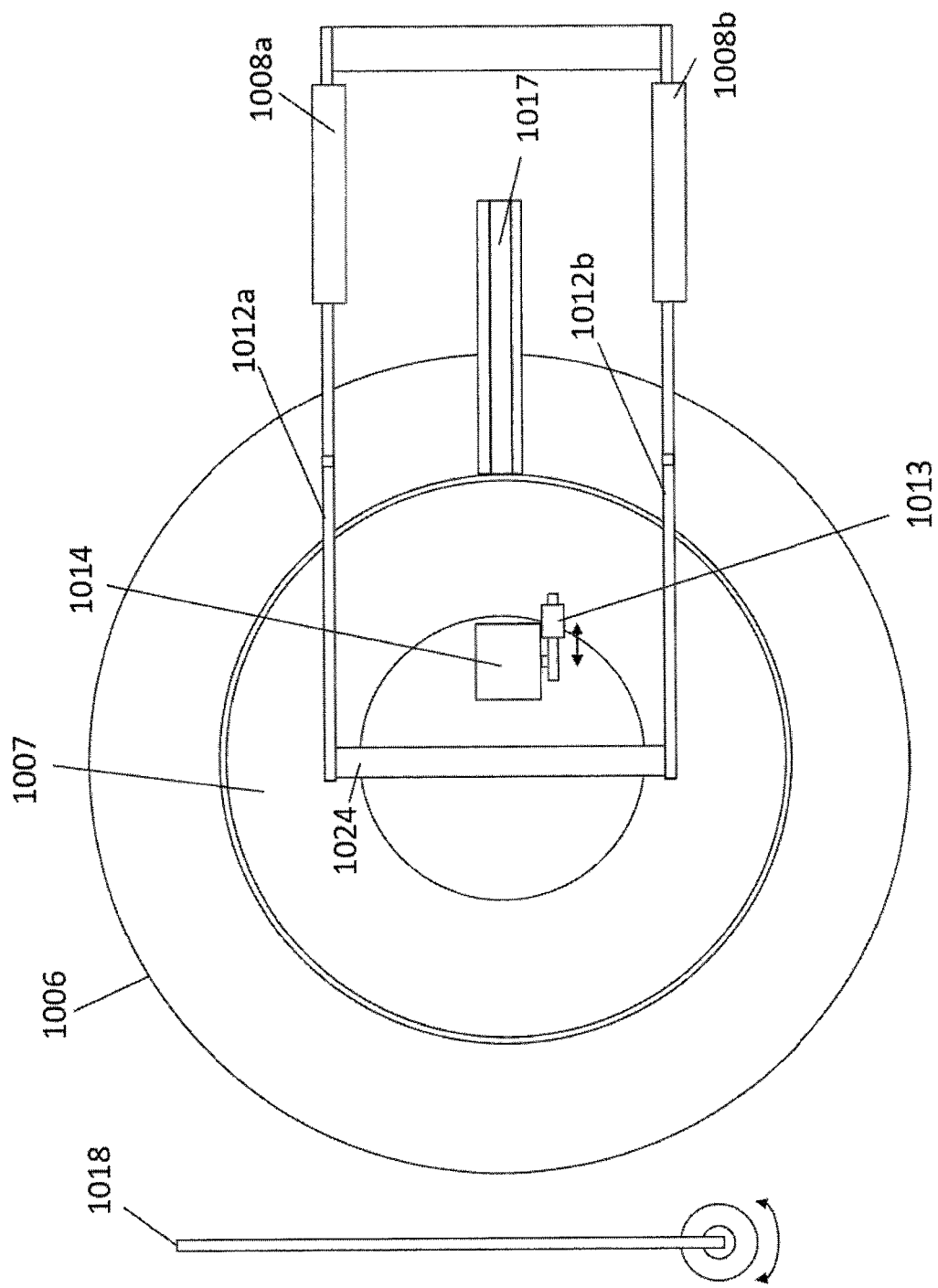
FIG. 2 is a top view of the apparatus shown in FIG. 1.
Figure 3:
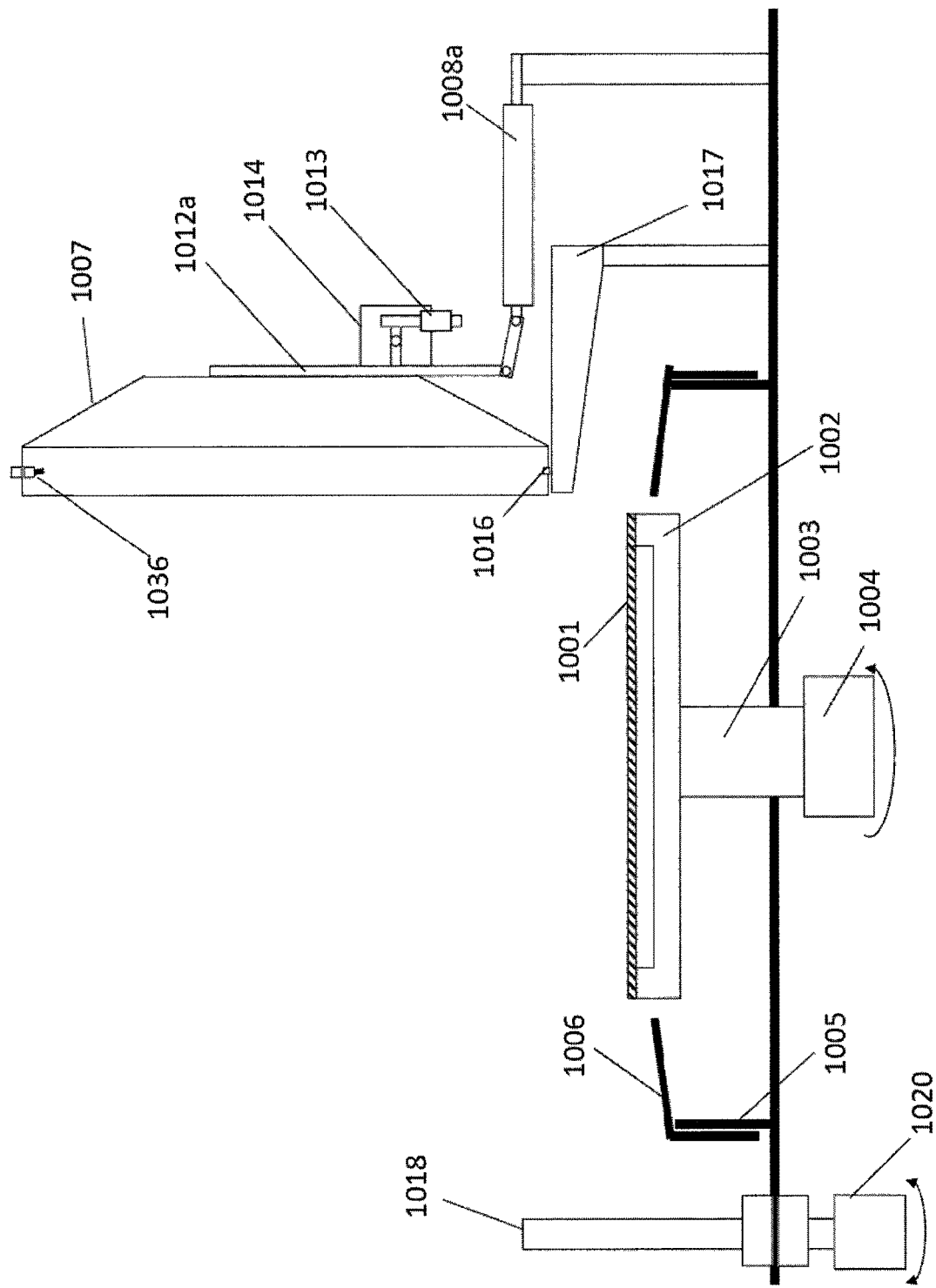
FIG. 3 is a side view illustrating the shielding cover is lifted up.
Figure 4:
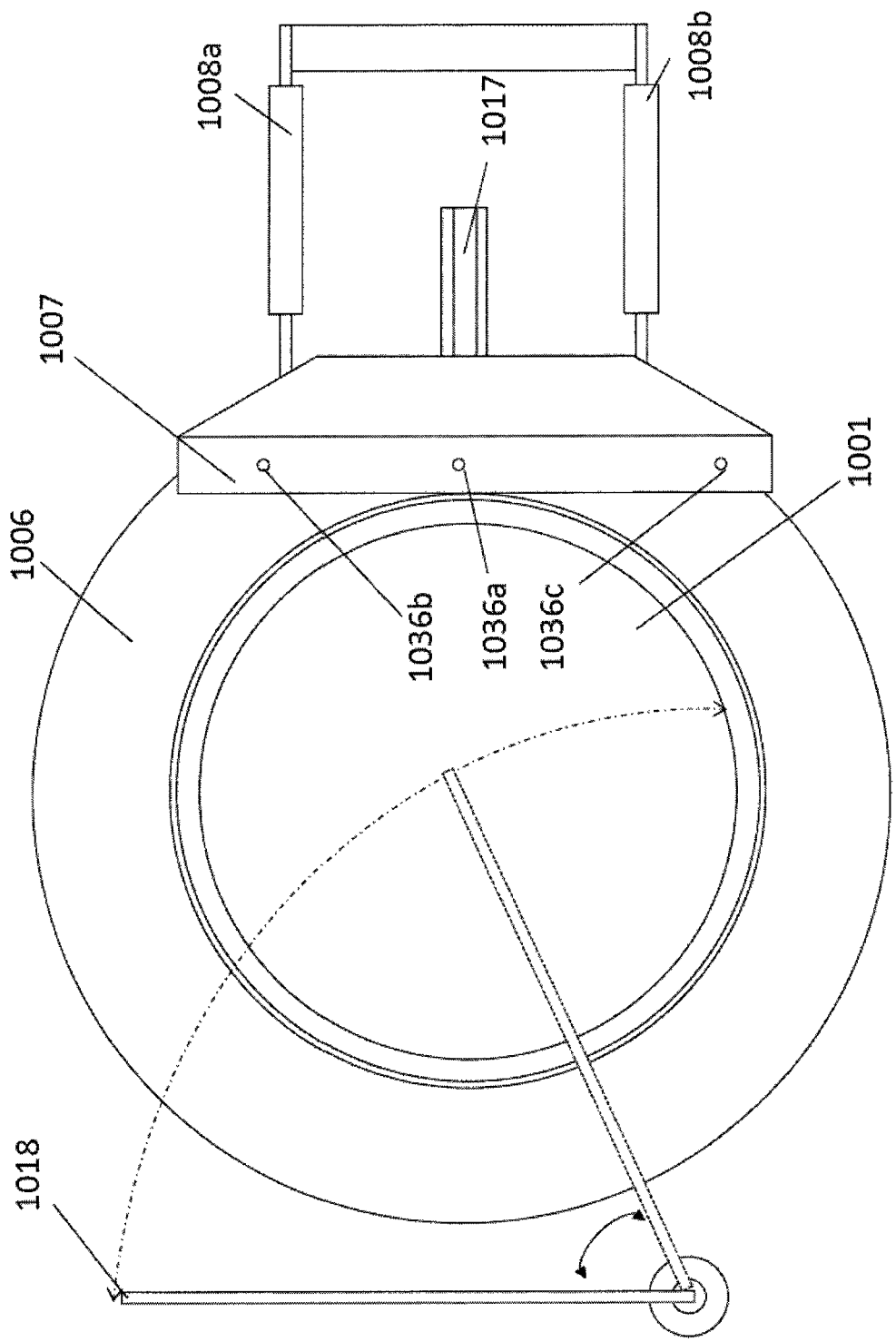
FIG. 4 is a top view of the apparatus shown in FIG. 3.

As shown in FIG. 1 and FIG. 2, when using the apparatus for wet process on the semiconductor substrate 1001, such as cleaning, etching, photo-resist stripping, metal lift-off, etc., the semiconductor substrate 1001 is put on the chuck 1002. The rotating driving mechanism 1004 drives the chuck 1002 to rotate at speed of 20-3000 rpm. The shielding cover 1007 is driven to cover the process chamber 1005 by the driving devices 1008*a*, 1008*b*. Then the chamber shroud 1006 is driven to move up. The combination of the shielding cover 1007 and the chamber shroud 1006 seals the process chamber 1005, so as to prevent the high pressure chemical or de-ionized water sprayed on the surface of the semiconductor substrate 1001 from splashing out of the process chamber 1005. The high pressure chemical or de-ionized water is sprayed on the surface of the semiconductor substrate 1001 at pressure of 10-5000 psi through the high pressure dispenser 1030 of the high pressure dispenser module 1014. After the high pressure processing of the semiconductor substrate 1001 is finished, as shown in FIG. 3 and FIG. 4, the chamber shroud 1006 is driven to move down. Then the shielding cover 1007 is driven to lift up by the driving devices 1008*a*, 1008*b*. The shielding cover 1007 is beside the process chamber 1005. Subsequently, the chamber shroud 1006 is driven to move up and then the rotating actuator 1020 drives the swing nozzle 1018 to move into the process chamber 1005 for delivering liquid of chemicals or de-ionized water, or drying gas on the surface of the semiconductor substrate 1001. The chamber shroud 1006 is at the down position when the shielding cover 1007 is driven to cover the process chamber 1005 or lift up beside the opening of the process chamber 1005, so that there is enough space for the shielding cover 1007 easily moving.

Figure 5:
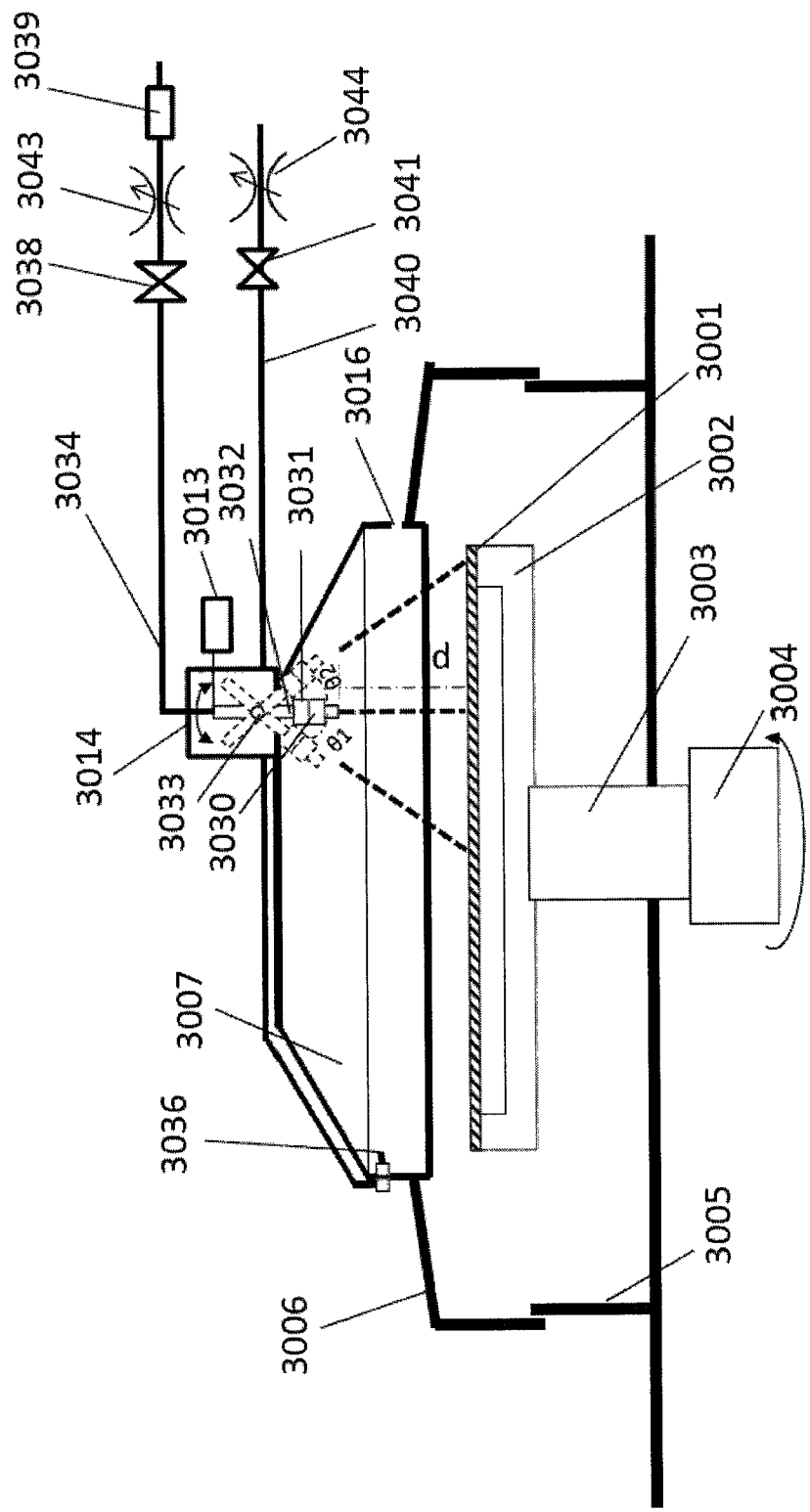
FIG. 5 is a side view illustrating a high pressure dispenser module of the apparatus according to an embodiment of the present invention.

Referring to FIG. 5, a high pressure dispenser module according to an embodiment of the present invention is illustrated. The high pressure dispenser module 3014 is mounted on the shielding cover 3007. The high pressure dispenser module 3014 has a high pressure dispenser 3030. The high pressure dispenser 3030 is mounted on a receptacle 3031 which is fixed on an end of a swing arm 3032. The high pressure dispenser module 3014 has a linear actuator 3013 for controlling the scanning motion of the high pressure dispenser 3030. Specifically, the linear actuator 3013 drives the swing arm 3032 to rotate from θ1 to θ2 around a shaft 3033. As shown in FIG. 5, if the linear actuator 3013 drives the swing arm 3032 to rotate at θ1, the liquid delivered from the high pressure dispenser 3030 is sprayed to the center of the semiconductor substrate 3001. If the linear actuator 3013 drives the swing arm 3032 to rotate at θ2, the liquid delivered from the high pressure dispenser 3030 is sprayed to the edge of the semiconductor substrate 3001. In this way, the high pressure liquid is sprayed on the surface of the semiconductor substrate 3001 uniformly from the center to edge of the semiconductor substrate 3001 during the swing arm 3032 rotating from θ1 to θ2 while the rotating driving mechanism 3004 drives the chuck 3002 to rotate. The distance "d" between the high pressure dispenser 3030 and the surface of the semiconductor substrate 3001 can be adjusted by adjusting the length of the swing arm 3032. The high pressure dispenser 3030 is mounted on the receptacle 3031 by a way of quick connect and the high pressure dispenser 3030 is easily replaced with the desired types of high pressure dispenser. Using different types of high pressure dispenser 3030, the liquid sprayed from the high pressure dispenser 3030 can be selected in cone shape, column shape or fan shape. A line 3034 is connected to the high pressure dispenser 3030 to supply the high pressure chemical or de-ionized water to the high pressure dispenser 3030. A pressure gauge 3039 is set on the line 3034 to control the pressure at 10 to 5000 psi. A flow gauge 3043 is set on the line 3034 to control the flow rate. An on/off valve 3038 is set on the line 3034 to control the supplying of high pressure liquid from the line 3034. There is another line 3040 connected to the cleaning nozzle 3036 for supplying the cleaning chemical or de-ionized water to the cleaning nozzle 3036 to clean the inner surface of the shielding cover 3007. There is another flow gauge 3044 set on the line 3040 to control the flow rate. There is another on/off valve 3041 set on the line 3040 to control the supplying of the cleaning chemical or de-ionized water from the line 3040.

Figure 6:
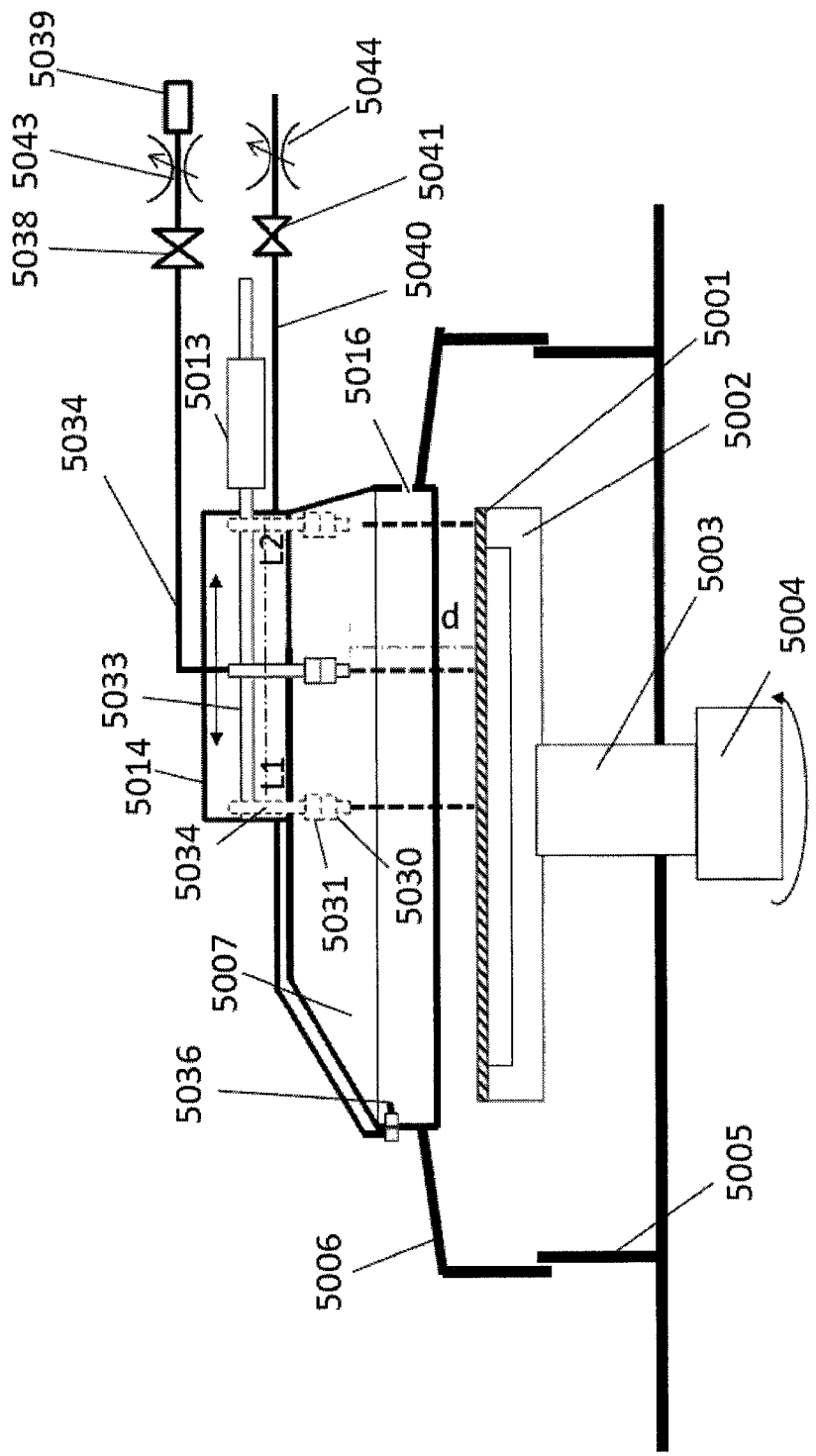
FIG. 6 is a side view illustrating a high pressure dispenser module of the apparatus according to another embodiment of the present invention.

Referring to FIG. 6, a high pressure dispenser module according to another embodiment of the present invention is illustrated. The high pressure dispenser module 5014 is mounted on the shielding cover 5007. The high pressure dispenser module 5014 has a high pressure dispenser 5030. The high pressure dispenser 5030 is mounted on a receptacle 5031 which is fixed on an end of a rod 5034. The high pressure dispenser module 5014 has a linear actuator 5013 for controlling the scanning motion of the high pressure dispenser 5030. Specifically, the linear actuator 5013 drives the rod 5034 to move from L1 to L2 along a shaft 5033. If the linear actuator 5013 drives the rod 5034 to move at L1, the liquid delivered from the high pressure dispenser 5030 is sprayed to the center of the semiconductor substrate 5001. If the linear actuator 5013 drives the rod 5034 to move at L2, the liquid delivered from the high pressure dispenser 5030 is sprayed to the edge of the semiconductor substrate 5001. In this way, the high pressure liquid can be sprayed on the surface of the semiconductor substrate 5001 uniformly from the center to edge of the semiconductor substrate 5001 during the rod 5034 moving from L1 to L2 while the rotating driving mechanism 5004 drives the chuck 5002 to rotate. The distance "d" between the high pressure dispenser 5030 and the surface of the semiconductor substrate 5001 can be adjusted by adjusting the length of the rod 5034. The high pressure dispenser 5030 is mounted on the receptacle 5031 by a way of quick connect and the high pressure dispenser 5030 is easily replaced with the desired types of high pressure dispenser. Using different types of high pressure dispenser 5030, the liquid sprayed from the high pressure dispenser 5030 can be selected in cone shape, column shape or fan shape. A line 5034 is connected to the high pressure dispenser 5030 to supply the high pressure chemical or de-ionized water to the high pressure dispenser 5030. A pressure gauge 5039 is set on the line 5034 to control the pressure at 10 to 5000 psi. A flow gauge 5043 is set on the line 5034 to control the flow rate. An on/off valve 5038 is set on the line 5034 to control the supplying of high pressure liquid from the line 5034. There is another line 5040 connected to the cleaning nozzle 5036 for supplying the cleaning chemical or de-ionized water to the cleaning nozzle 5036 to clean the inner surface of the shielding cover 5007. There is another flow gauge 5044 set on the line 5040 to control the flow rate. There is another on/off valve 5041 set on the line 5040 to control the supplying of the cleaning chemical or de-ionized water from the line 5040.

Accordingly, the present invention provides a method for wet process on a semiconductor substrate, which utilizes a shielding cover combined with a chamber shroud to seal a process chamber, preventing high pressure liquid from splashing out of the process chamber when the high pressure liquid is uniformly sprayed on the semiconductor substrate through a high pressure dispenser module.

Referring to FIG. 7A to FIG. 7H, a process sequence is illustrated.

Figure 7A:
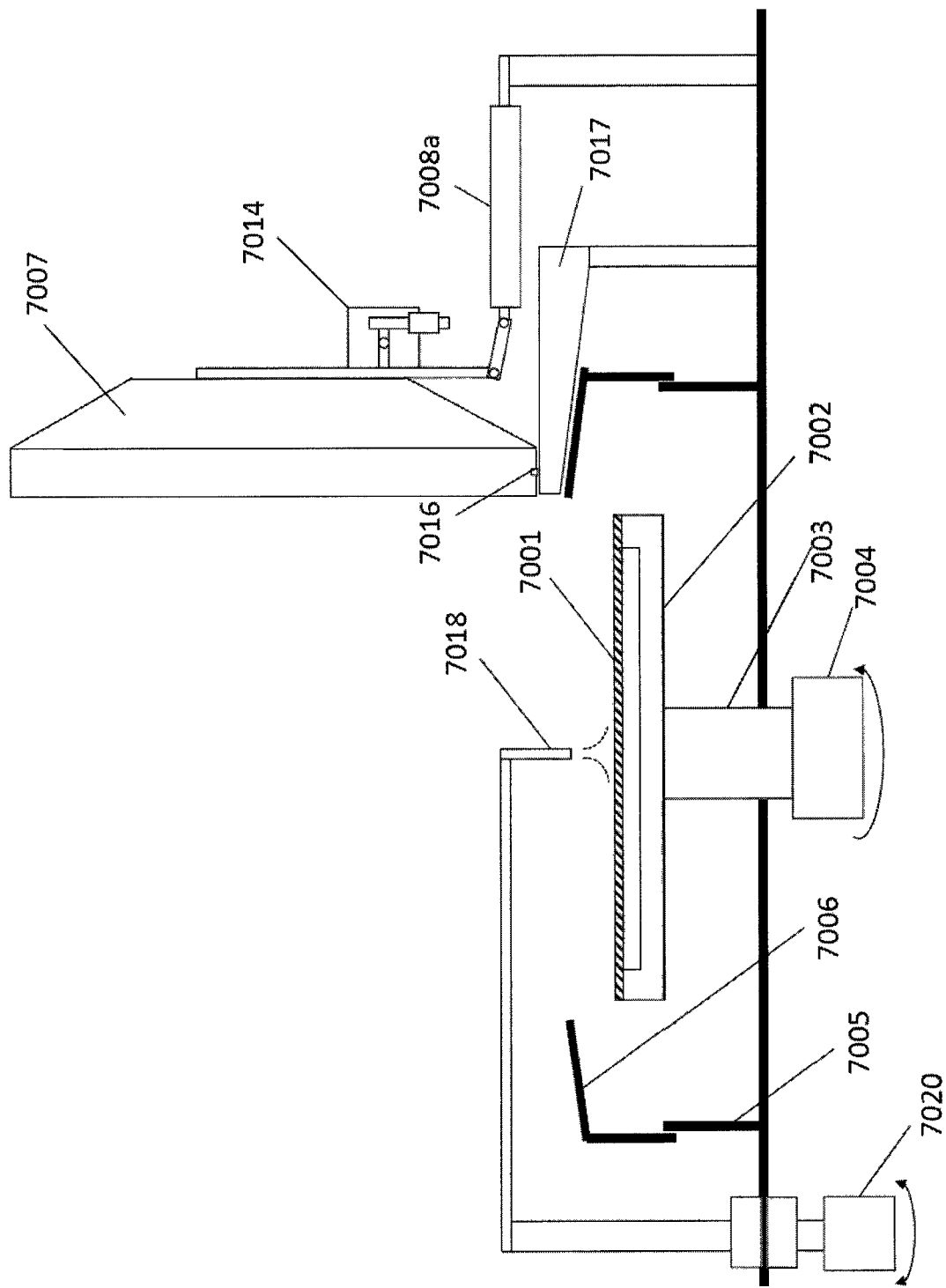
Figure 7C:
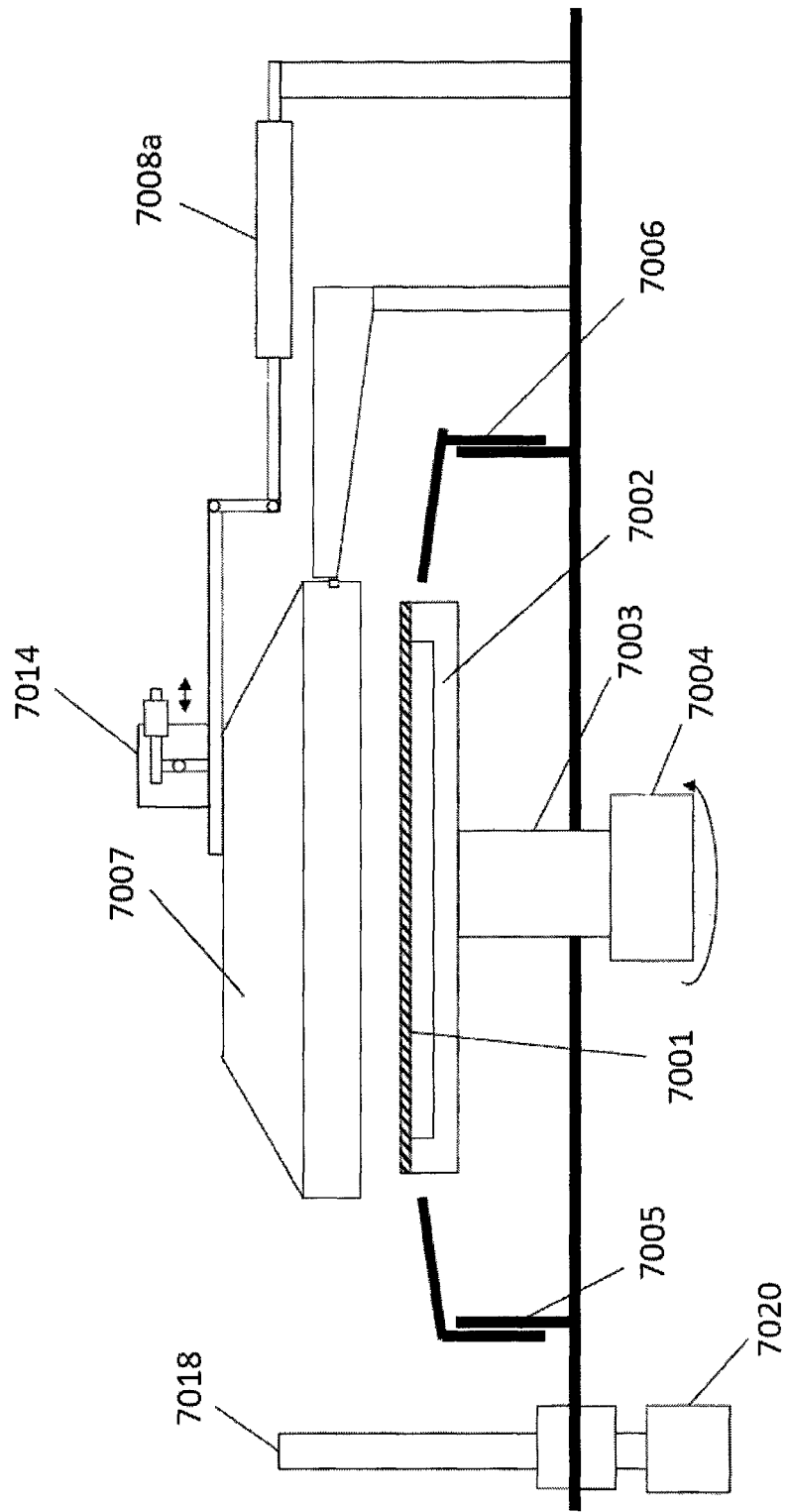
Figure 7D:
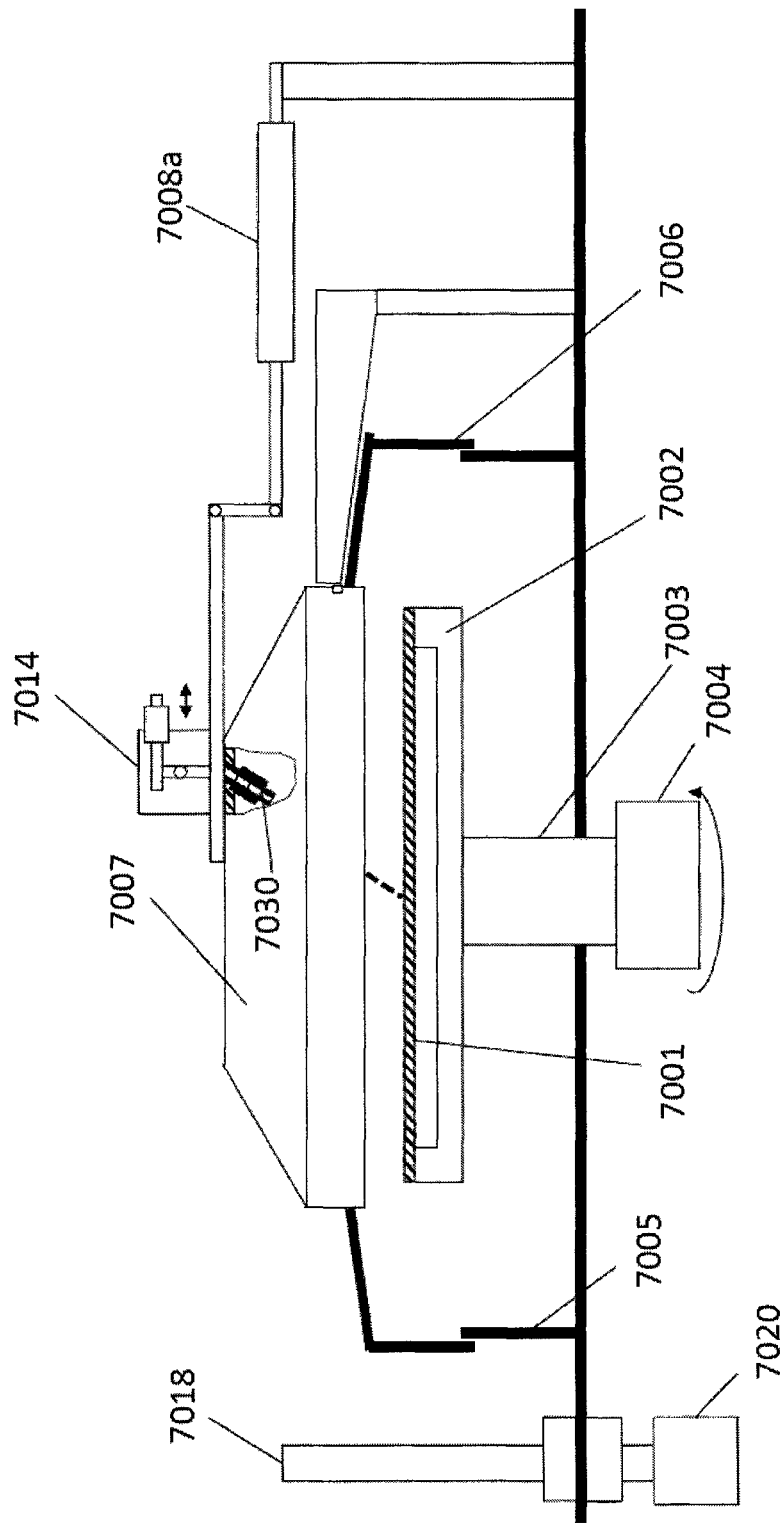
Figure 7E:
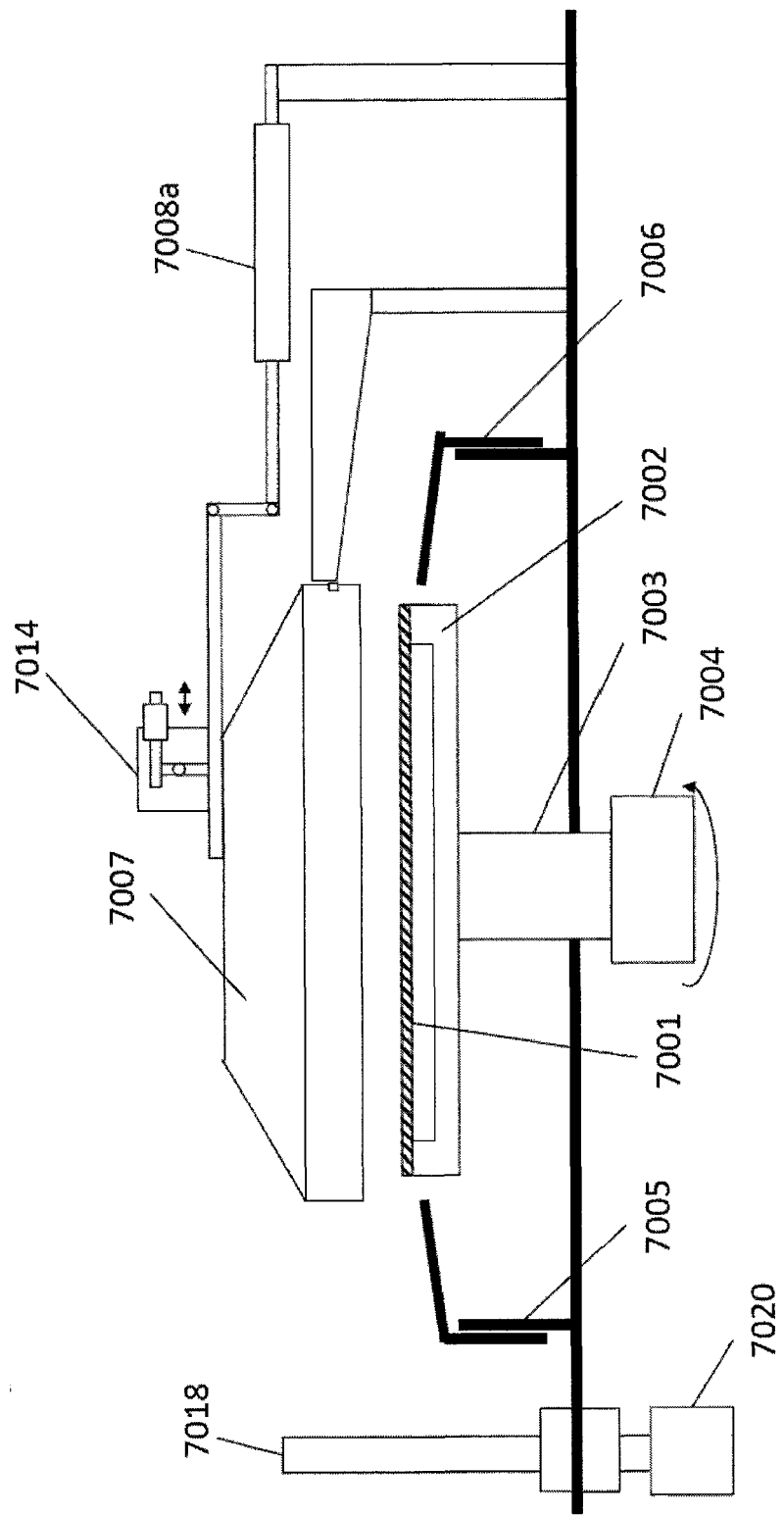
Figure 7F:
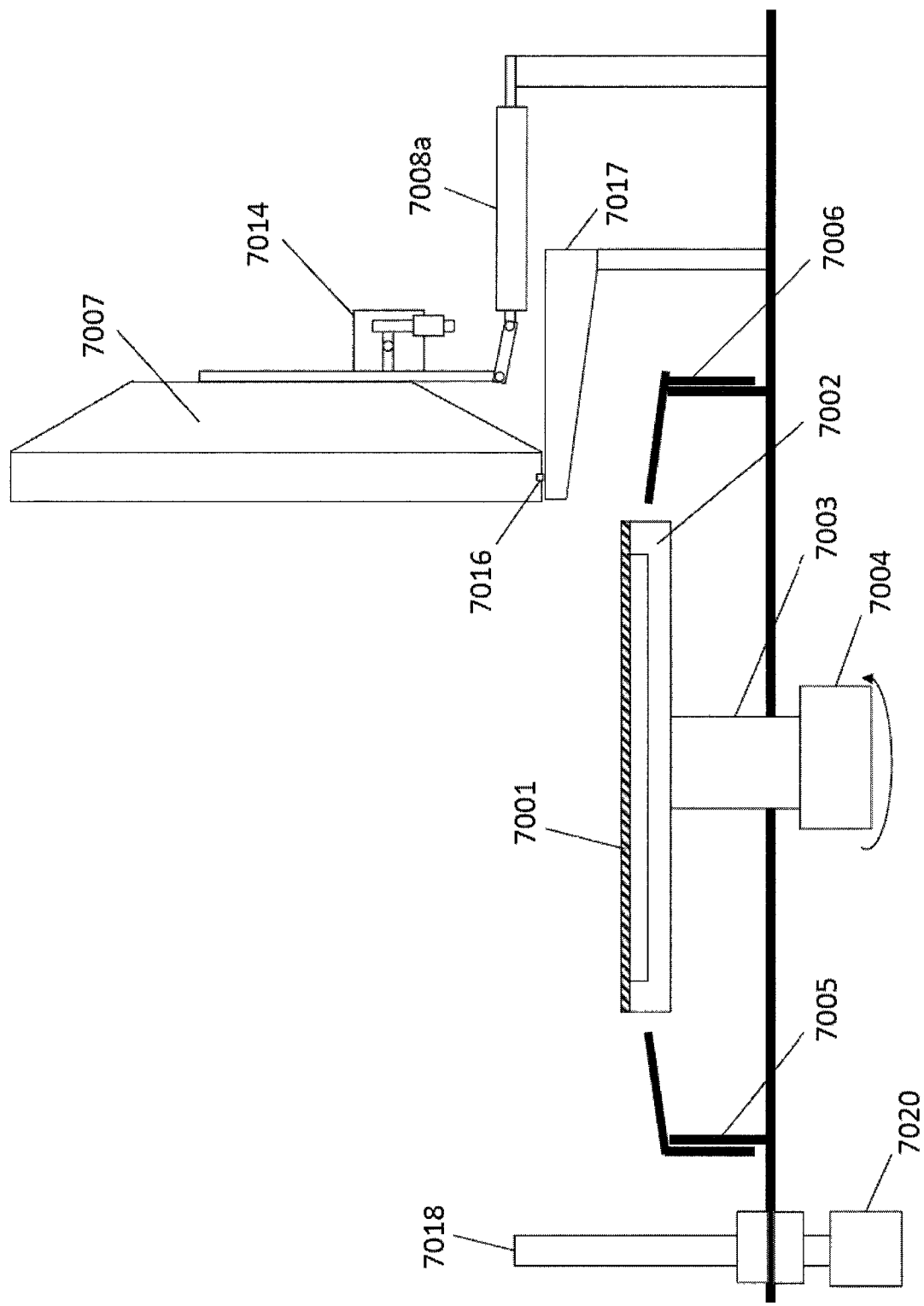
Figure 7G:
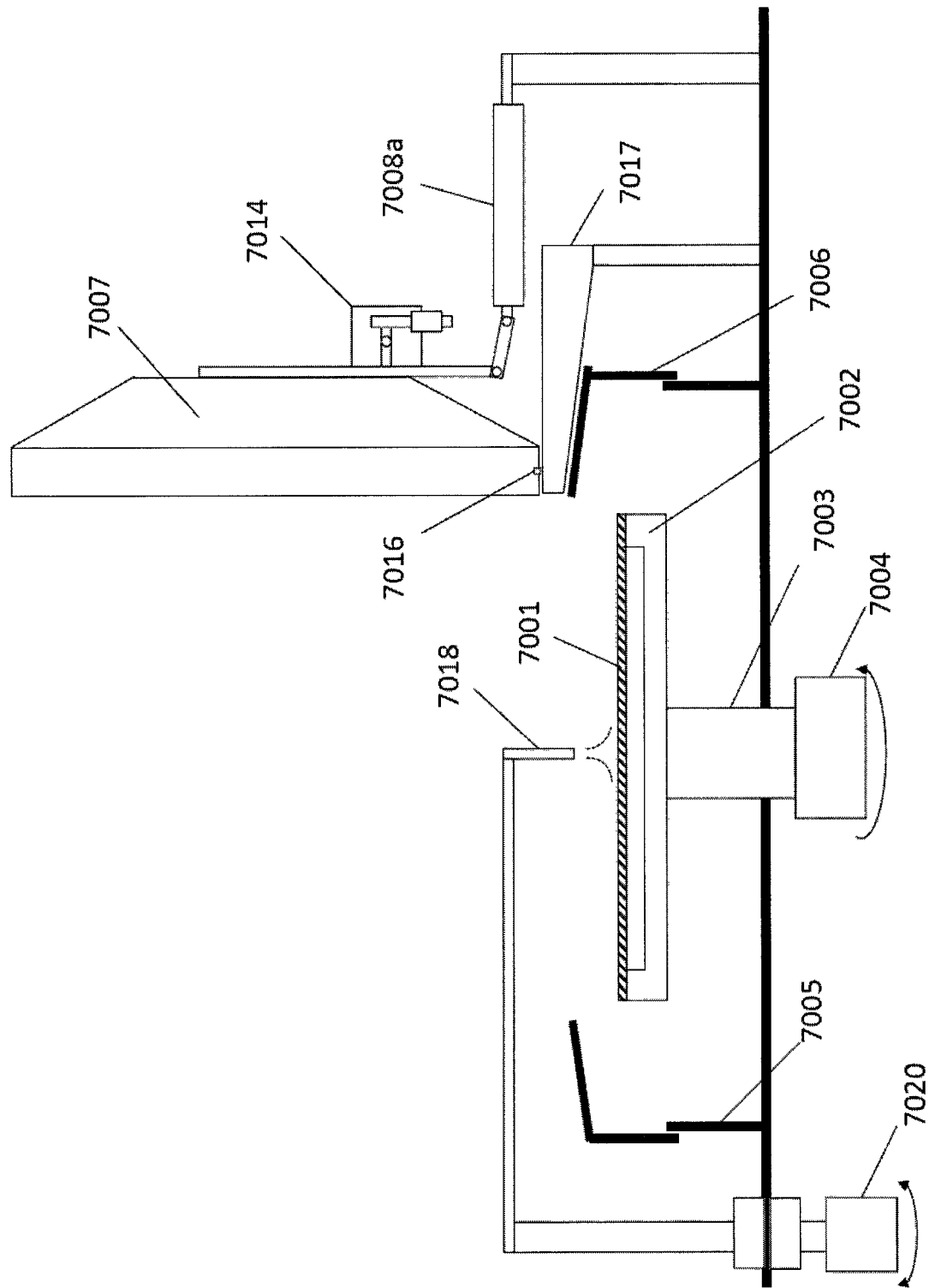
Figure 7H:
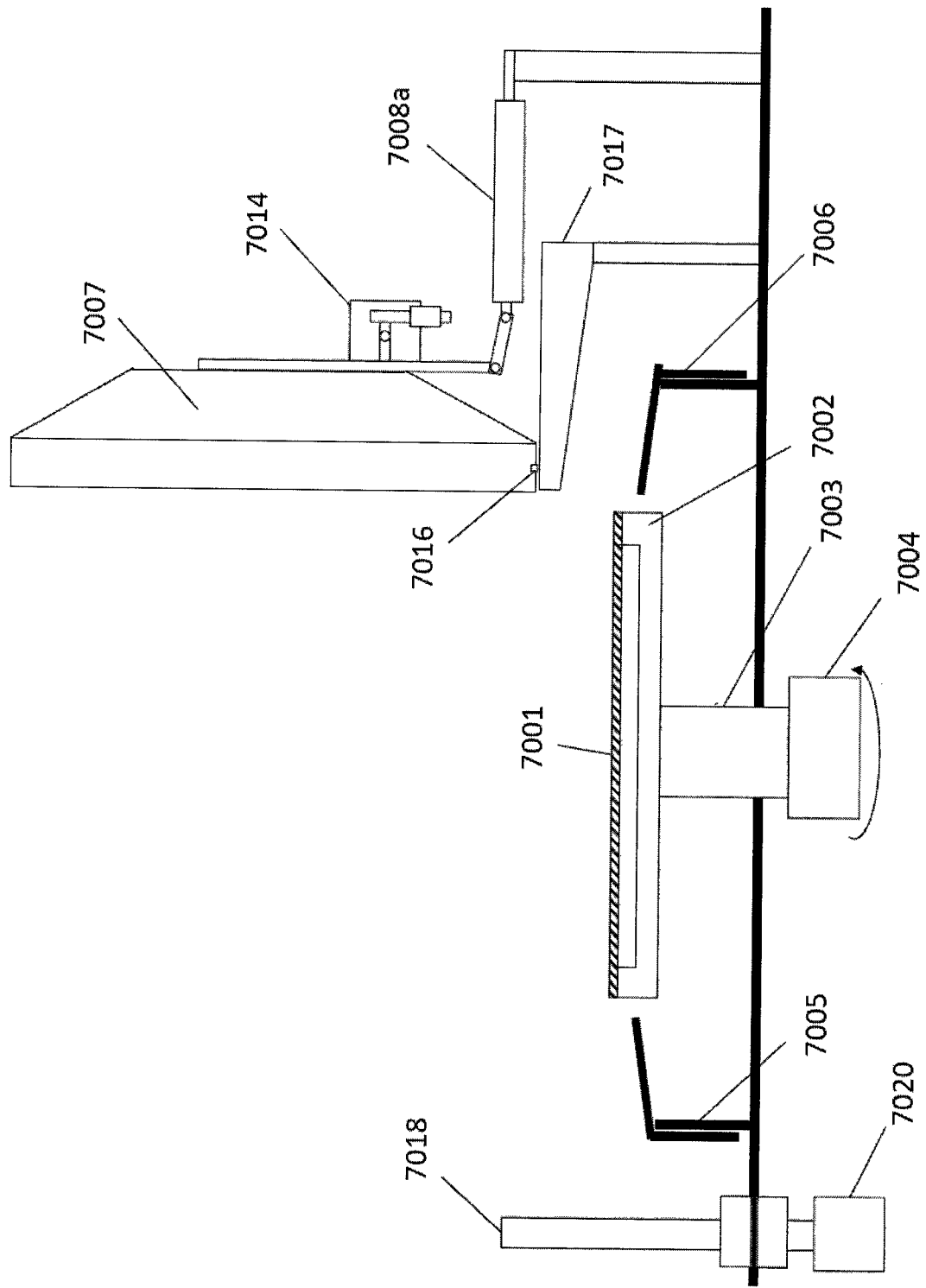

Step 1: moving down the chamber shroud 7006, loading the semiconductor substrate 7001 on the chuck 7002, moving up the chamber shroud 7006, and rotating the semiconductor substrate 7001 with speed of 10 RPM to 3000 RPM;

Step 2: rotating the swing nozzle 7018 into the process chamber 7005 to deliver cleaning chemical or de-ionized water to the surface of the semiconductor substrate 7001, as shown in FIG. 7A;

Step 3: stopping delivering cleaning chemical or de-ionized water to the surface of the semiconductor substrate 7001, rotating the swing nozzle 7018 out of the process chamber 7005, and then moving down the chamber shroud 7006, as shown in FIG. 7B;

Step 4: driving the shielding cover 7007 to cover the process chamber 7005, as shown in FIG. 7C;

Step 5: moving up the chamber shroud 7006 to couple with the shielding cover 7007, the combination of the shielding cover 7007 and the chamber shroud 7006 sealing the process chamber 7005, and then delivering high pressure chemical or de-ionized water from the high pressure dispenser 7030 to the surface of the semiconductor substrate 7001, as shown in FIG. 7D;

Step 6: stopping delivering the high pressure chemical or de-ionized water to the surface of the semiconductor substrate 7001, and then moving down the chamber shroud 7006, as shown in FIG. 7E;

Step 7: driving the shielding cover 7007 to lift up, as shown in FIG. 7F;

Step 8: moving up the chamber shroud 7006, and then rotating the swing nozzle 7018 into the process chamber 7005 to deliver cleaning chemical or de-ionized water to the surface of the semiconductor substrate 7001, as shown in FIG. 7G;

Step 9: drying the semiconductor substrate 7001;

Step 10: rotating the swing nozzle 7018 out of the process chamber 7005, stopping rotating the semiconductor substrate 7001, moving down the chamber shroud 7006, and then unloading the semiconductor substrate 7001 from the chuck 7002.

In the step 5, the high pressure dispenser 7030 is driven to scan between the center and edge of the semiconductor substrate 7001 for uniformly spraying the high pressure chemical or de-ionized water to the surface of the semiconductor substrate 7001. The pressure of the high pressure chemical or de-ionized water is controlled in range of 10 psi to 5000 psi, and the flow rate of the high pressure chemical or de-ionized water is controlled in range of 10 ml to 4000 ml.

When the process chamber 7005 is idle and the shielding cover 7007 is lifted up, the cleaning nozzle delivers cleaning chemical or de-ionized water to the inner surface of the shielding cover 7007 for cleaning the shielding cover 7007. The delivery duration of the cleaning nozzle is programmable. The cleaning triggering condition is programmable based on processing the number of the semiconductor substrate or time accumulation.

The foregoing description of the present invention has been presented for purposes of illustration and description. It is not intended to be exhaustive or to limit the invention to the precise form disclosed, and obviously many modifications and variations are possible in light of the above teaching. Such modifications and variations that may be apparent to those skilled in the art are intended to be included within the scope of this invention as defined by the accompanying claims.

What is claimed is:

1. An apparatus for performing a wet process on a semiconductor substrate, comprising:
   a process chamber;
   a chuck for holding and positioning a semiconductor substrate disposed in the process chamber;
   a rotating driving mechanism driving the chuck to rotate;
   a chamber shroud disposed surrounding the process chamber;
   at least one vertical driving mechanism driving the chamber shroud to move up or down;
   a shielding cover;
   at least one driving device driving the shielding cover to move down or lift up;
   at least one dispenser module having a dispenser for spraying liquid onto the surface of the semiconductor substrate while the semiconductor substrate is positioned on the chuck and covered by the shielding cover;
   wherein when the shielding cover covers the process chamber, the chamber shroud is moved up to couple with the shielding cover, so as to close the process chamber for preventing the liquid from splashing out of the process chamber; and wherein at least one drain hole is disposed in a side wall of the shielding cover when the shielding cover is in a horizontal state, and wherein the shielding cover is configured to be lifted and oriented from the horizontal state to a vertical state in which the drain hole is at a bottom of the shielding cover such that liquid can drain out of the shielding cover through the drain hole.

2. The apparatus according to claim 1, wherein the dispenser module has a linear actuator for controlling a scanning motion of the dispenser.

3. The apparatus according to claim 1, wherein the shielding cover is fixed on a beam, two ends of the beam connect with two arms, and the two arms are actuated by a pair of driving devices for driving the shielding cover to move down or lift up.

4. The apparatus according to claim 1, further comprising a drain tray used to receive liquid from the drain hole.

5. The apparatus according to claim 1, wherein at least one cleaning nozzle is disposed on the shielding cover for delivering cleaning liquid to an inner surface of the shielding cover for cleaning the shielding cover.

6. The apparatus according to claim 5, wherein the cleaning nozzle is mounted at an angle to prevent the cleaning liquid from spraying to an inside of the chamber shroud.

7. The apparatus according to claim 5, wherein a delivery duration of cleaning liquid from the cleaning nozzle is programmable, and wherein a cleaning triggering condition for cleaning the shielding cover is programmable.

8. The apparatus according to claim 1, wherein a top section of the shielding cover is shaped in a slope or an arc.

9. The apparatus according to claim 1, further comprising at least one swing nozzle disposed beside the process chamber for delivering chemicals or de-ionized water or drying gas onto the surface of the semiconductor substrate.

10. The apparatus according to claim 9, further comprising a rotating actuator driving the swing nozzle to rotate.

11. The apparatus according to claim 1, wherein the chamber shroud is at a down position when the shielding cover is driven to move down or lift up.

12. The apparatus according to claim 2, wherein the dispenser is mounted on a receptacle which is fixed on an end of a swing arm, wherein the linear actuator drives the swing arm to rotate from θ1 to θ2 around a shaft, and wherein the liquid is sprayed onto the surface of the semiconductor substrate uniformly from a center of the substrate to an edge of the substrate during the swing arm rotating from θ1 to θ2 while the rotating driving mechanism drives the chuck to rotate.

13. The apparatus according to claim 12, wherein a distance "d" between the dispenser and a surface of the semiconductor substrate is adjusted by adjusting the length of the swing arm.

14. The apparatus according to claim 2, wherein the dispenser is mounted on a receptacle which is fixed on an end of a rod, wherein the linear actuator drives the rod to move from L1 to L2 along a shaft, and wherein the liquid is sprayed on the surface of the semiconductor substrate uniformly from a center of the substrate to an edge of the substrate during the rod moving from L1 to L2 while the rotating driving mechanism drives the chuck to rotate.

15. The apparatus according to claim 14, wherein a distance "d" between the dispenser and a surface of the semiconductor substrate is adjusted by adjusting the length of the rod.

16. The apparatus according to claim 1, wherein a pressure of the liquid sprayed onto the surface of the semiconductor substrate by the dispenser is controlled to be in a range of 10 psi to 5000 psi.

17. A method of wet processing a semiconductor substrate, comprising:

moving down a chamber shroud;

driving a shielding cover to cover a process chamber containing a semiconductor substrate;

moving up the chamber shroud to couple with the shielding cover for closing the process chamber, and then delivering chemical liquid or de-ionized water from a dispenser to the surface of the semiconductor substrate while the shielding cover is coupled with the chamber shroud;

stopping delivering the chemical liquid or de-ionized water to the surface of the semiconductor substrate, and then moving down the chamber shroud;

driving the shielding cover to be lifted and oriented from a horizontal state to a vertical state; and draining the chemical liquid or de-ionized water out through at least one drain hole disposed in a side wall of the shielding cover, wherein the drain hole is at a bottom of the shielding cover when the shielding cover is in the vertical state to allow liquid to drain out of the shielding cover when the shielding cover is lifted and oriented into the vertical state.

18. The method according to claim 17, further comprising driving the dispenser to scan between a center and an edge of the semiconductor substrate for uniformly spraying the chemical liquid or de-ionized water to the surface of the semiconductor substrate.

19. The method according to claim 17, wherein a pressure of the chemical liquid or de-ionized water is controlled to be in a range of 10 psi to 5000 psi.

20. The method according to claim 17, further comprising delivering cleaning chemical or de-ionized water to an inner surface of the shielding cover for cleaning the shielding cover when the process chamber is idle and the shielding cover is lifted up.

21. The method according to claim 20, wherein a delivery duration of cleaning chemical or de-ionized water to the shielding cover is programmable, and wherein a cleaning triggering condition is programmable.

22. The method according to claim 20, before the step of moving down a chamber shroud, the method further comprises:

loading the semiconductor substrate on a chuck, moving up the chamber shroud, and rotating the semiconductor substrate;

rotating a swing nozzle into the process chamber to deliver cleaning chemical or de-ionized water to the surface of the semiconductor substrate;

stopping delivering cleaning chemical or de-ionized water to the surface of the semiconductor substrate, and rotating the swing nozzle out of the process chamber.

23. The method according to claim 22, after the step of driving the shielding cover to be lifted and oriented from a horizontal state to a vertical state, the method further comprises:

moving up the chamber shroud, and then rotating the swing nozzle into the process chamber to deliver cleaning chemical or de-ionized water to the surface of the semiconductor substrate;

drying the semiconductor substrate;

rotating the swing nozzle out of the process chamber, stopping rotating the semiconductor substrate, moving down the chamber shroud, and then unloading the semiconductor substrate from the chuck.

* * * * *